United States Patent
Fogal et al.

[11] Patent Number: 6,047,468
[45] Date of Patent: Apr. 11, 2000

[54] LEAD FINGER CLAMP ASSEMBLY AND METHOD OF STABILIZING LEAD FRAME ELEMENTS

[75] Inventors: Rich Fogal; Michael B. Ball, both of Boise, Id.

[73] Assignee: Micron Technology, Inc., Boise, Id.

[21] Appl. No.: 09/015,285

[22] Filed: Jan. 29, 1998

Related U.S. Application Data

[62] Division of application No. 08/592,058, Jan. 26, 1996, Pat. No. 5,954,842.

[51] Int. Cl.[7] .................................................. H01R 43/00
[52] U.S. Cl. ............................ 29/827; 29/854; 29/25.01; 228/44.7; 228/110.1; 228/212
[58] Field of Search .................................. 29/25.01, 827, 29/854; 228/44.7, 106, 110.1, 212

[56] References Cited

U.S. PATENT DOCUMENTS

| | | |
|---|---|---|
| 3,685,137 | 8/1972 | Gardiner . |
| 4,030,657 | 6/1977 | Scheffer . |
| 4,361,261 | 11/1982 | Elles et al. . |
| 4,434,347 | 2/1984 | Kurtz et al. . |
| 4,600,138 | 7/1986 | Hill . |
| 4,603,803 | 8/1986 | Chan et al. . |
| 4,653,681 | 3/1987 | Dreibelbis et al. . |
| 4,765,531 | 8/1988 | Ricketson et al. . |
| 4,778,097 | 10/1988 | Hauser . |
| 4,800,421 | 1/1989 | Davis et al. ............................ 357/80 |
| 4,821,945 | 4/1989 | Chase et al. . |
| 4,862,245 | 8/1989 | Pashby et al. . |
| 5,035,034 | 7/1991 | Cotney . |
| 5,062,565 | 11/1991 | Wood et al. . |
| 5,114,066 | 5/1992 | Amador et al. . |
| 5,148,959 | 9/1992 | Cain et al. . |
| 5,193,733 | 3/1993 | You . |
| 5,217,154 | 6/1993 | Elwood et al. . |
| 5,307,978 | 5/1994 | Fogal et al. . |
| 5,322,207 | 6/1994 | Fogal et al. ............................ 228/180.5 |
| 5,421,503 | 6/1995 | Perlberg et al. . |
| 5,425,491 | 6/1995 | Tanaka et al. . |
| 5,445,306 | 8/1995 | Huddleston . |
| 5,465,899 | 11/1995 | Quick et al. . |
| 5,558,267 | 9/1996 | Humphrey et al. ..................... 228/4.5 |
| 5,611,478 | 3/1997 | Asanasavest . |

*Primary Examiner*—Lee Young
*Assistant Examiner*—Binh-An Nguyen
*Attorney, Agent, or Firm*—Trask, Britt & Rossa

[57] ABSTRACT

An apparatus for stabilizing a semiconductor die and lead fingers of a lead frame during the process of wire bonding comprising a rigid clamp having at least one bond site window extending therethrough and at least one resilient secondary clamp which extends from an edge of the bond site window to a position over and in contact with lead fingers extending over the semiconductor die. The arrangement of the secondary clamp is such that the contact force with the semiconductor die is sufficient to minimize, dampen, or prevent movement of the semiconductor die and/or lead finger bounce during the wire bonding process. Methods of clamping are also disclosed.

17 Claims, 7 Drawing Sheets

LEAD FINGER CLAMP ASSEMBLY AND METHOD OF STABILIZING LEAD FRAME ELEMENTS

This Application is a Divisional of Ser. No. 08/592,058 filed Jan. 26, 1996. U.S. Pat. No. 5,954,842.

BACKGROUND OF THE INVENTION

1. Field of the Invention

The present invention relates to an apparatus for stabilizing lead frame elements against a heater block or a semiconductor die active surface during wire bonding operations wherein the lead fingers of the lead frame are electrically connected to the bonding pads of a semiconductor die by bond wires.

2. State of the Art

Typical wire bonded semiconductor devices, such as plastic encapsulated integrated circuit devices, utilize a component called a lead frame for physical support and electrical connection of a semiconductor die to external circuitry. Typically, the lead frame is formed in a strip, with others of like configuration, from a single continuous ribbon of stamped metal. The lead frames are generally stamped or etched from copper alloy, so-called Alloy 42, red brass, stainless steel, or the like. The lead frame structure includes an outer supporting frame, a central semiconductor die supporting pad (also termed a tab, island or paddle) and a plurality of inwardly-extending lead fingers terminating short of the perimeter of the die attach location and each having a terminal bonding portion at the inner lead end. The outer supporting frame is ultimately removed subsequent to encapsulation of the wire-bonded die and leads, and forms no part of the finished device.

In the assembly of semiconductor devices utilizing such lead frames, a semiconductor die is secured to the central supporting pad (such as by a solder or epoxy die-attach, although a double-sided adhesive tape-type attach has also been suggested in the art) and then the entire lead frame, with the semiconductor die thereon, is placed into a wire bonding apparatus including a clamp assembly for holding the lead frame and die assembly, and clamping the lead fingers for bonding.

U.S. Pat. No. 4,862,245 issued Aug. 29, 1989 to Pashby et al. illustrates a so-called "leads over chip" arrangement ("LOC") on the semiconductor die (see FIG. 5). A plurality of lead fingers 106 extend over the active surface of a semiconductor die 100 toward a line of bond pads 104 wherein bond wires 102 make the electrical connection between the lead fingers 106 and the bond pads 104. An alpha barrier 108 such as a polyimide (for example, Kapton™) tape is adhered between the semiconductor die 100 and the lead fingers 106. This configuration, which eliminates the use of the previously-referenced central die attach pad, may assist in limiting the ingress of corrosive environment contaminants, achieve a larger portion of the lead finger path length encapsulated in the packaging material, and reduce electrical resistance caused by the bond wires 102 (i.e. the longer the bond wire, the higher the resistance) and potential wire sweep problems aggravated by long wire loops.

In a standard wire bonding process, the bond wires are attached, one at a time, from each bond pad on the semiconductor die and to a corresponding lead finger. The bond wires are generally attached through one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

To form a good bond during the wire bonding processing, it is preferable to perform the bonding at an elevated and somewhat stable temperature. Therefore, as noted above, the lead frame assembly including the attached semiconductor die is generally placed on a heater block. The semiconductor die is then clamped (via the lead frame) to the heater block by the clamping assembly. With a conventional lead frame, the lead fingers are clamped directly against the underlying heater block. In an LOC structure, the lead fingers are biased between the clamp and the active surface of the semiconductor die heater block.

In an LOC structure, the Kapton™ tape comprising the alpha barrier or dielectric between the semiconductor and the lead fingers becomes soft at the elevated temperature. The softening of the tape allows the lead fingers and/or semiconductor die to move in response to ultrasonic energy or pressure (force) exerted by the wire bonding head (capillary). As a result, the mechanical integrity of the wire bond to the lead fingers is diminished. Furthermore, a "bouncing" motion is imparted to the lead fingers by the wire bonding head movement, which motion may be exacerbated by the heat softened tape. This bouncing motion can also result in poor wire bonds which subsequently fail.

Thus, die fabricators are somewhat compelled to select the die attach compound (or other means) and alpha barrier tape based on the thermal stability of the materials rather than on the basis of the most effective material for a given application.

Therefore, it would be advantageous to develop an apparatus for stabilizing the semiconductor die and the lead fingers during the wire bonding process to minimize or eliminate the bouncing motion and/or the movement of the semiconductor die or the lead fingers and thus compensate for the inherent deficiencies of the clamping and wire bonding process.

There have been several previous attempts to overcome the foregoing problems. For example, for bonding LOC structures, rigid clamping plates having bond site windows therein have been reconfigured so that the bond site window is reduced in size and the downwardly-extending lip or periphery contacts the lead fingers extending over the die and clamps the lead fingers directly thereto. However, the rigid clamp has been found to be too rigid and unyielding for use with an LOC configuration and may possibly damage the die. Moreover, it has been found that the use of a rigid clamp does not necessarily ensure that each lead finger will in fact be immobilized, due to dimensional variations in lead thickness, tape thickness and die surface topography.

It has also been proposed to employ resilient elastomeric elements or other compliant material at the bottom of the lip of a rigid clamp to ensure more consistent contact with lead fingers in clamping against a die or heater block. However, it has been ascertained that the compliant materials soon lose their elasticity, conform to the underlying lead finger pattern and thus become ineffective.

U.S. Pat. No. 4,821,945 discloses a bond head assembly including an integral, vertically-movable and selectively rotatable clamp adjacent and partially surrounding the capillary to clamp individual inner lead finger ends when each wire is bonded to a lead finger. The disclosure is directed, in part, to clamping an LOC structure for wire bonding.

U.S. Pat. No. 5,035,034 discloses a modified clamp using a changeable insert on the underside thereof, the insert having a plurality of resilient fingers to clamp the individual leads of a lead frame. This structure is employed in lieu of a conventional clamp structure using a lip or extended bond site periphery to clamp the lead fingers. It appears that clamping an LOC structure for wire bonding is not specifically contemplated.

U.S. Pat. No. 5,193,733 discloses several different clamp structures, including a primary clamp structure using an extended lip to clamp inner lead finger ends of a conventional (non-LOC) lead frame in combination with a leaf-spring type auxiliary clamp secured to the primary clamp to contact the die attach pad. Also disclosed is an arrangement wherein leaf-spring type or coil-spring biased clamping structures are secured to a primary clamp without the conventional lip or extended periphery, the spring-biased clamps serving to press the lead fingers, either individually or in groups, against the heater block. Again, no consideration was apparently given to clamping an LOC structure for wire bonding.

SUMMARY OF THE INVENTION

In accordance with the present invention, a novel apparatus for stabilizing a semiconductor die and associated lead fingers during the wire bonding process is provided. The apparatus of the invention, broadly stated, comprises a substantially rigid primary clamp as known in the art, in combination with at least one resilient, secondary clamp which may contact a portion of the lead frame (such as lead fingers or buses) extending over the semiconductor die, the active surface of the die itself, or portions of the lead fingers laterally adjacent the semiconductor die. The secondary clamp is preferably in addition to a rigid, standard clamp contacting the lead frame about the periphery of the semiconductor die.

In one preferred embodiment of the invention, a rigid, plate-type primary clamp having at least one bond site window extending therethrough is provided with a pair of resilient secondary clamps extending from opposing sides of the bond site window. The arrangement of the secondary clamps is such that when the primary clamp is set over the semiconductor die, the secondary clamps contact the semiconductor die (usually through lead fingers on buses extending over the die) with a force sufficient to minimize or prevent movement of the semiconductor die and/or the lead fingers during the wire bonding process. The minimization or prevention of movement beneficially accommodates absorption of ultrasonic energy or pressure exerted by the bond head during the wire bonding process. Furthermore, the secondary clamps assist in damping any bouncing motion imparted to elements of the lead frame structure by the wire bonding head movement and exacerbated by heat softened alpha barrier tape between the lead fingers and the active surface of the die. Additionally, the arrangement of the secondary clamps is preferably such that the operational movement of the wire bonding head during the wire bonding process is not impeded. The resilient nature of contact of the die surface by the secondary clamps precludes damage to the die due to the relatively low level of force imparted to the active surface.

In another preferred embodiment of the invention, a primary clamp including an extended lip or periphery about the bond site window includes one or more secondary clamping structures which contact the lead fingers inboard of contact by the rigid primary clamp but outboard of the die. Such an arrangement has equal utility with both conventional and LOC die assemblies.

Yet another preferred embodiment of the invention employs secondary clamps extending over the active surface of the die and lead fingers extending thereover, to clamp the lead fingers to the die for wire bonding to a central row of bond pads on the die.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
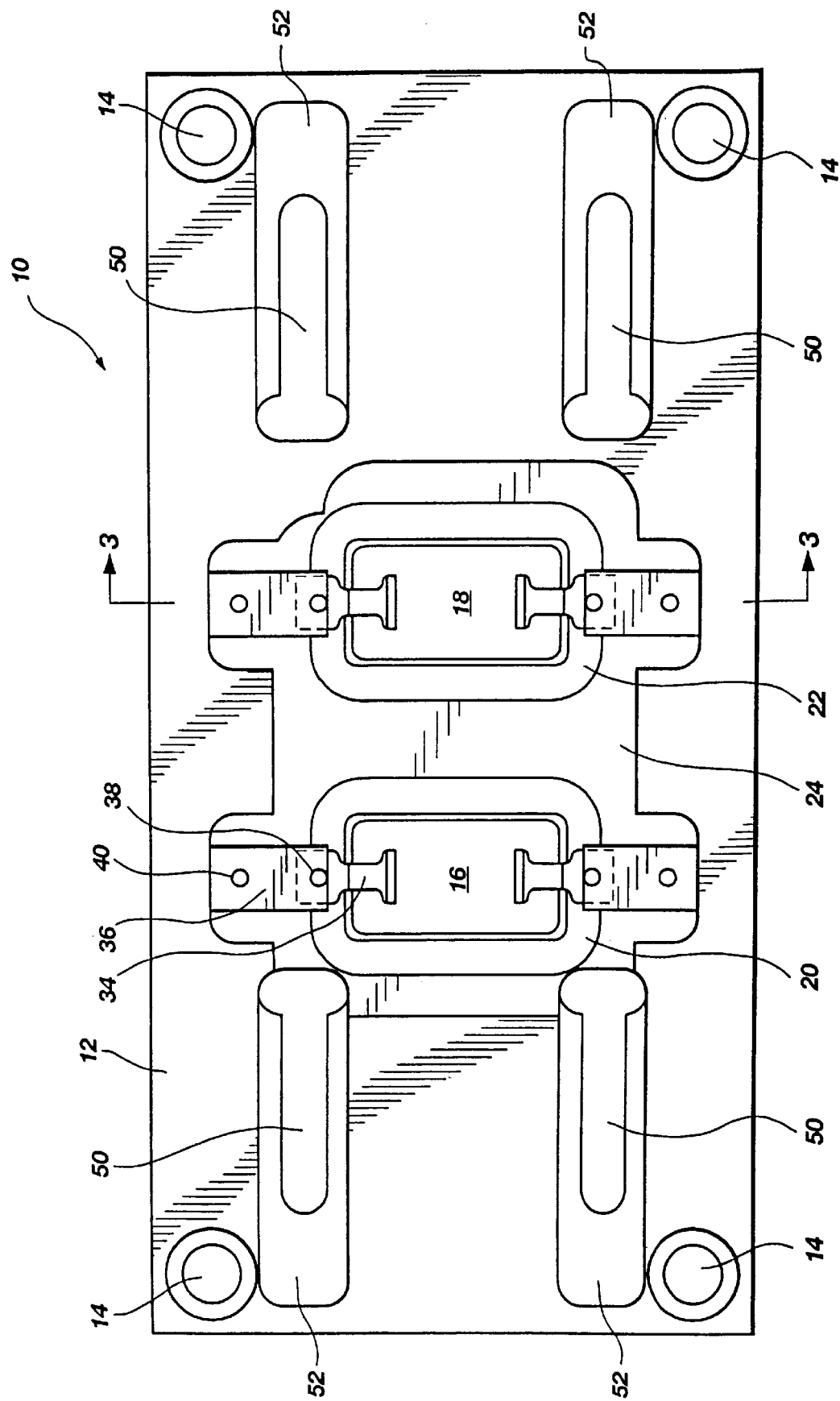
FIG. 1 is a top view of a preferred embodiment of the dual clamp apparatus of the present invention as employed in a dual bond site wire bonding assembly.

FIG. 1 illustrates an embodiment of the present invention designated as a dual clamp assembly 10. Assembly 10 includes a generally rectangular primary clamp 12 including four mounting holes 14 at the four corners. The mounting holes 14 are suitable for attaching the clamp 12 to matching holes on a mounting component (not shown) of a wire bonding apparatus. The clamp is formed from a substantially rigid material, such as metal or the like, and is vertically reciprocably movable toward and away from an underlying heater block as known in the art. The clamp 12 also includes four leaf spring members 50. The leaf spring members 50 are pivotally mounted in recessed areas 52 in the clamp 12. The leaf spring members 50 function to bias the assembly of the lead frame strip with attached die away from the clamp 12 upon the release of pressure of the clamp 12 from the lead frame strip.

The primary clamp 12 also includes two bond site windows 16, 18 extending completely through the clamp 12 from upper surface to lower surface. The bond site windows 16, 18 are generally rectangular in shape and are spaced apart for proper indexing to match the spacing of the lead frames of the lead frame strip with attached die being wire bonded. Advantages of using multiple bond site windows are disclosed in U.S. Pat. No. 5,322,207 issued Jun. 21, 1994 to Fogal et al., which is hereby incorporated by reference.

The bond site windows 16, 18 are bordered by inner recesses 20, 22 defined at their inner peripheries by sloped walls extending downwardly to the window peripheries. In addition, a larger outer relief 24 or recess is formed around the two bond site windows 16, 18, encompassing inner recesses 20, 22.

Figure 2:
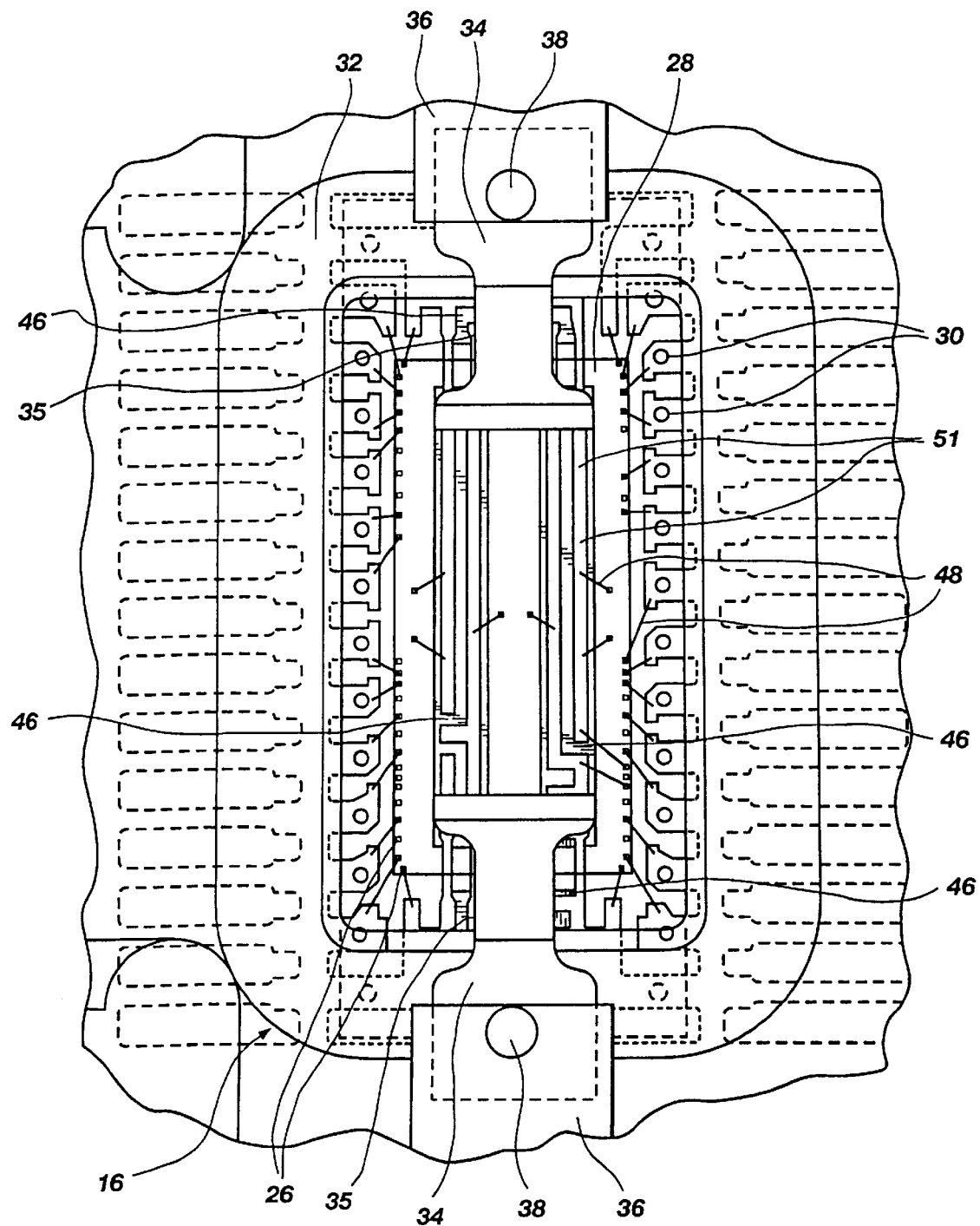
FIG. 2 is a top view of one die recess or bond site of FIG. 1 with a semiconductor die therein.

As shown in FIG. 2 with respect to an exemplary bond site window 16, the bond site windows 16, 18 are sized to allow access for a wire bonding tool head or capillary (not shown) to a plurality of bond pads 26 of semiconductor die 28 and to a plurality of lead fingers 30 of a lead frame 32.

Figure 3:
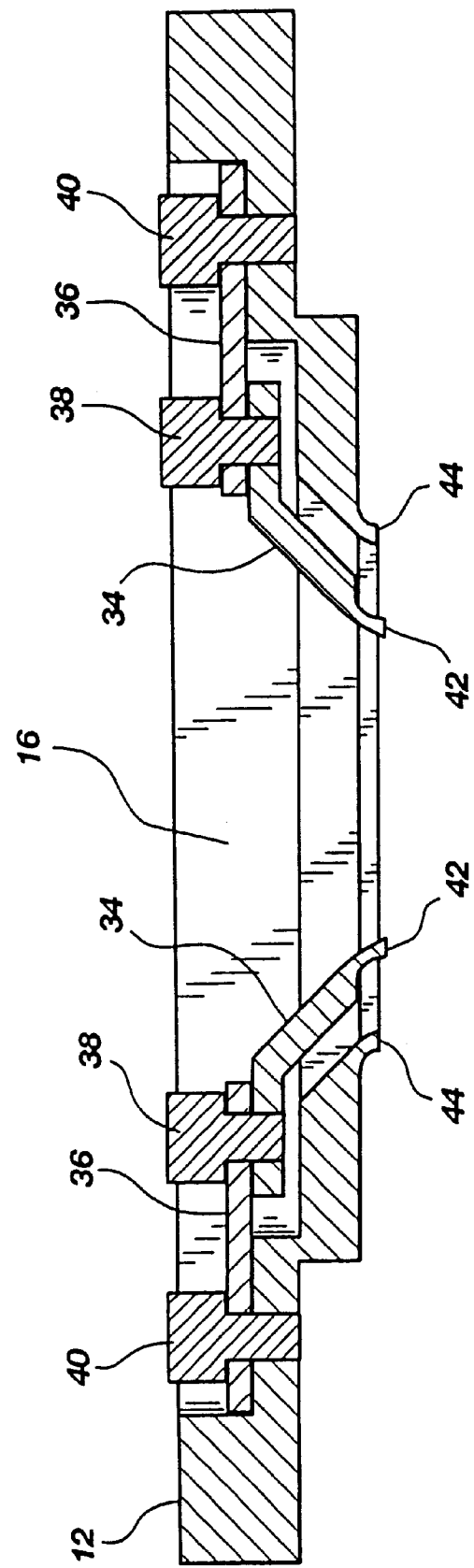
FIG. 3 is a side cross-sectional view of the present invention taken along line 3—3 of FIG. 1.

Referring again to FIG. 1, each bond site window 16, 18 includes an opposing pair of secondary clamps 34. As shown in FIGS. 1 and 3, the secondary clamps 34 are mounted to a distal end of a resilient plate 36 with a first set screw or bolt 38. The proximal end of each plate 36 is attached to the primary clamp 12 with a second set screw or bolt 40. It is, of course, understood that secondary clamps 34 can be attached to the clamp 12 in any number of known configurations, including forming the clamps 34 with an integral resilient portion which is secured to the clamp 12 or forming (for example, as by machining) the secondary clamp 34 as an integrated, resilient appendage of the clamp 12. It is, of course, also understood that any number of secondary clamps 34 can be used, consistent with the need for adequate clearances for wire bonding.

As shown in FIG. 2, when a semiconductor die 28 mounted to the lead frame strip including lead frames 32 is aligned with a bond site window 16 in the primary clamp 12 and pressure is exerted on the lead frame 32, the contact ends 42 of the secondary clamps 34 contact the semiconductor die 28 through buses 51 extending from lead frame 32 over the active die surface and an underlying alpha barrier or dielectric tape 46. The secondary clamps 34 do not damage the semiconductor die 28 under the secondary clamp contact ends 42 because the resilient nature of the secondary clamps 34 results in a controlled force, typically on the order of 50 to 100 grams, being applied. It should be noted that clamps 34 are configured with lateral cut-outs or recesses 35 to provide additional clearance for wire bonding tools. Such cut-outs may be of any suitable shape and size consistent with maintaining adequate torsional and bending rigidity of clamp 34.

The semiconductor die 28 has an LOC arrangement wherein the lead fingers 30 and buses 51 extend over the upper (active) semiconductor die 28. Buses 51 are adhered to an alpha barrier or dielectric tape 46 (typically, as noted previously, Kapton™ tape) which is in turn adhered to the surface of the semiconductor die 28. Lead fingers 30 free-float over the die surface but are not adhered thereto. The bond site window contact lip 44 (FIG. 3) contacts the lead fingers 30 around the periphery of the semiconductor die 28. The opposing pair of secondary clamps 34 extend toward the center of the semiconductor die 28, making contact therewith through buses 51 in this instance. A plurality of bond wires 48 is then attached between the bond pads 26 of the semiconductor die 28 and the lead fingers 30 and buses 51.

As shown in FIG. 3, contact ends 42 of the secondary clamps 34 in their unbiased state preferably extend slightly below a peripheral lead finger contact lip 44 of each bond site windows 16, 18 of the clamp 12. The secondary clamps 34 may be formed from a substantially rigid, non-deformable material such as metal, high-temperature plastic, fiber composites, or the like. A preferred material for the secondary clamps 34 is 440C stainless steel.

Figure 4A:
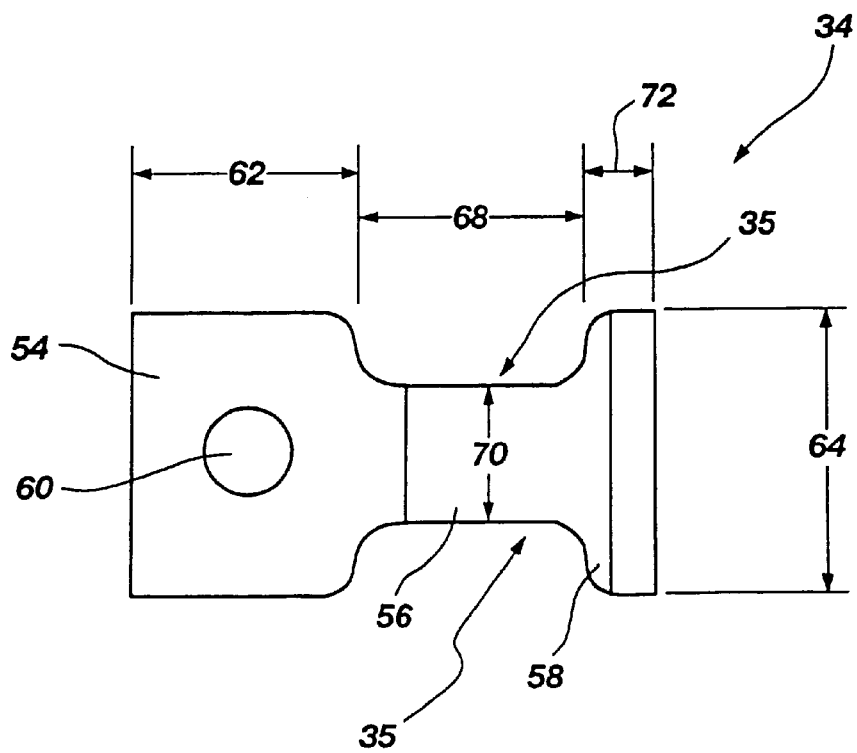
FIGS. 4A and 4B are a top and side plan view, respectively, of a single secondary clamp shown in FIGS. 1, 2 and 3.
Figure 4B:
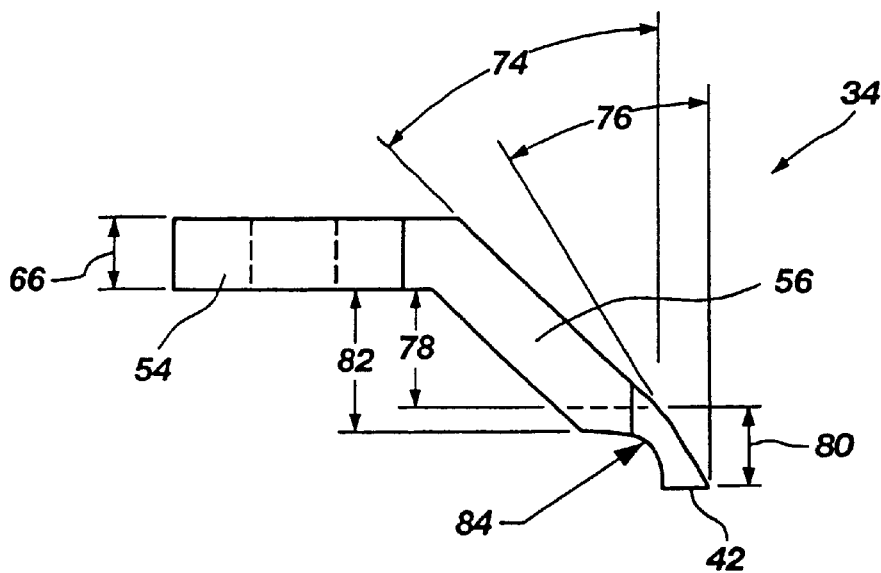
Figure 5:
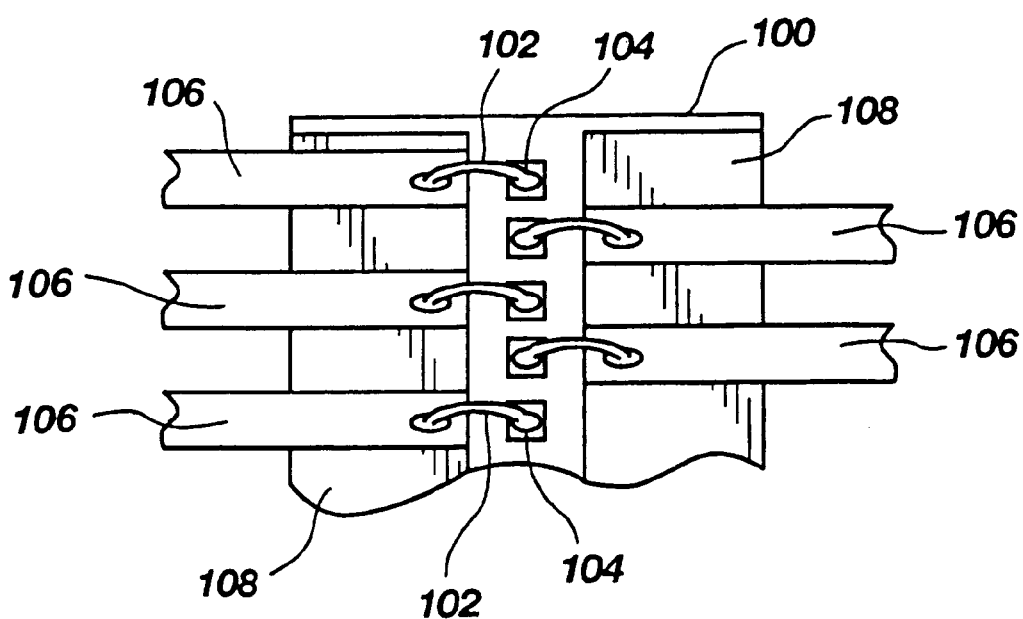
FIG. 5 illustrates a "leads over chip" semiconductor configuration.

FIGS. 4A and 4B illustrate an exemplary embodiment of the secondary clamp 34 as employed in FIG. 2. The secondary clamp comprises a mounting portion 54, an extension portion 56, and a contact portion 58. The mounting portion 54 has a length 62 of about 0.105 inches, a width 64 of about 0.140 inches, a thickness 66 of about 0.035 inches, and a hole 60 disposed therethrough. The extension portion 56 extends, angles, and tapers from the mounting portion 54 with a length 68 for cut-out 35 from the mounting portion 54 of about 0.125 inches, a tapered width 70 of about 0.070 inches, and an angle 74 of about 45 degrees. The contact portion 58 extends, angles, and expands from the extension portion 56 with a length 72 of about 0.035 inches, an expanded width identical to mounting portion width 64 of about 0.140 inches, and an angle 76 from the extension portion angle 74 of an additional 15 degrees resulting in an angle of about 30 degrees from vertical. The additional contact portion angle 76 begins at a first vertical distance 80 approximately 0.039 inches from the contact ends 42 or a second vertical distance 78 approximate 0.064 inches from the lower surface of the mounting portion 54. The contact portion thickness is thinned proximate to the contact surface 42 with a radial recess 84 of a radius of approximately 0.025 inches. The radial recess 84 begins at a third vertical distance 82 of approximately 0.073 inches from the lower surface of the mounting portion 54.

It is, of course, understood that the foregoing dimensions are given for illustration and proportional purposes only. It is understood that the actual clamp dimensions and configuration will vary depending on the clamp 12, bond site size, semiconductor die 28 size and bond pad and lead frame element patterns. The primary consideration is that the configuration and resilient biasing force applied by the secondary clamps be effective in stabilizing the semiconductor die and the lead elements (or other lead frame elements) during the wire bonding process to eliminate the bouncing motion and/or movement of the semiconductor die or the lead elements.

Figure 6:
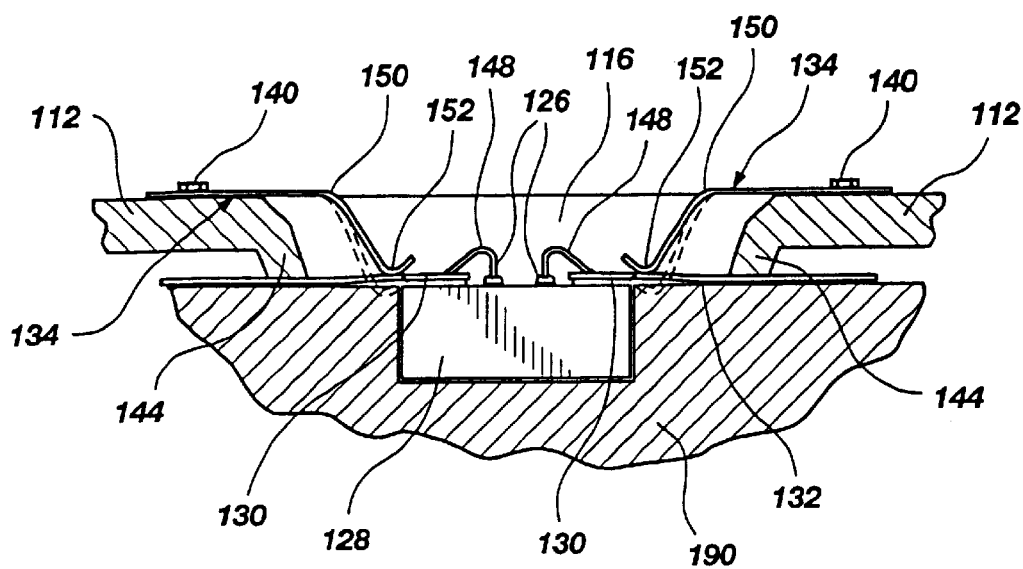
FIG. 6 is a side view of another preferred embodiment of the invention.

Referring now to FIG. 6 of the drawings, another preferred embodiment of the invention is depicted in a clamping mode. In this embodiment, exemplary primary or workholder clamp 112 including a peripheral lip 144 is positioned over a lead frame strip including a lead frame 132 aligned with a bond site window 116. Die 128, secured to the underside of lead frame 132, is being wire bonded at its bond pads 126 to the lead fingers by wire bonds 148. In this instance, secondary clamps 134 comprise (by way of example) leaf springs which are secured at their proximal ends to the upper surface of clamp 112 by screws or bolts 140. In their unbiased modes, shown in broken lines, secondary clamps 134 extend below the lip 144 and so contact lead frame 132 first when clamp 112 is activated, thus imparting a spring force to lead fingers 130 as clamp 112 reaches the lower extent of its downward travel. These one-piece secondary clamps 134 are formed by bending a leaf of spring steel or other suitable sheet metal downwardly at 150 and forming a presser foot 152 at the free or distal ends which contact the top of the lead fingers 130 outboard of die 128. As shown, presser foot 152 is of arcuate (convex) configuration, but this is not a requirement. Further, it should be noted that a coil or belleville spring structure might be employed to bias a presser foot, or even an elastomer may be used if the actual lead finger contact surface of the foot itself is of metal or another material which will not easily wear or form to the pattern of the lead fingers 30. As shown in FIG. 6, heater block 190 may be recessed to accommodate the depth of die 128 and permit lead fingers 130 to remain planar when being clamped against heater block 190 by lip 144 and against the active surface of die 128 by clamps 134. This particular embodiment has utility for both LOC and conventional die attach assemblies.

Figure 7:
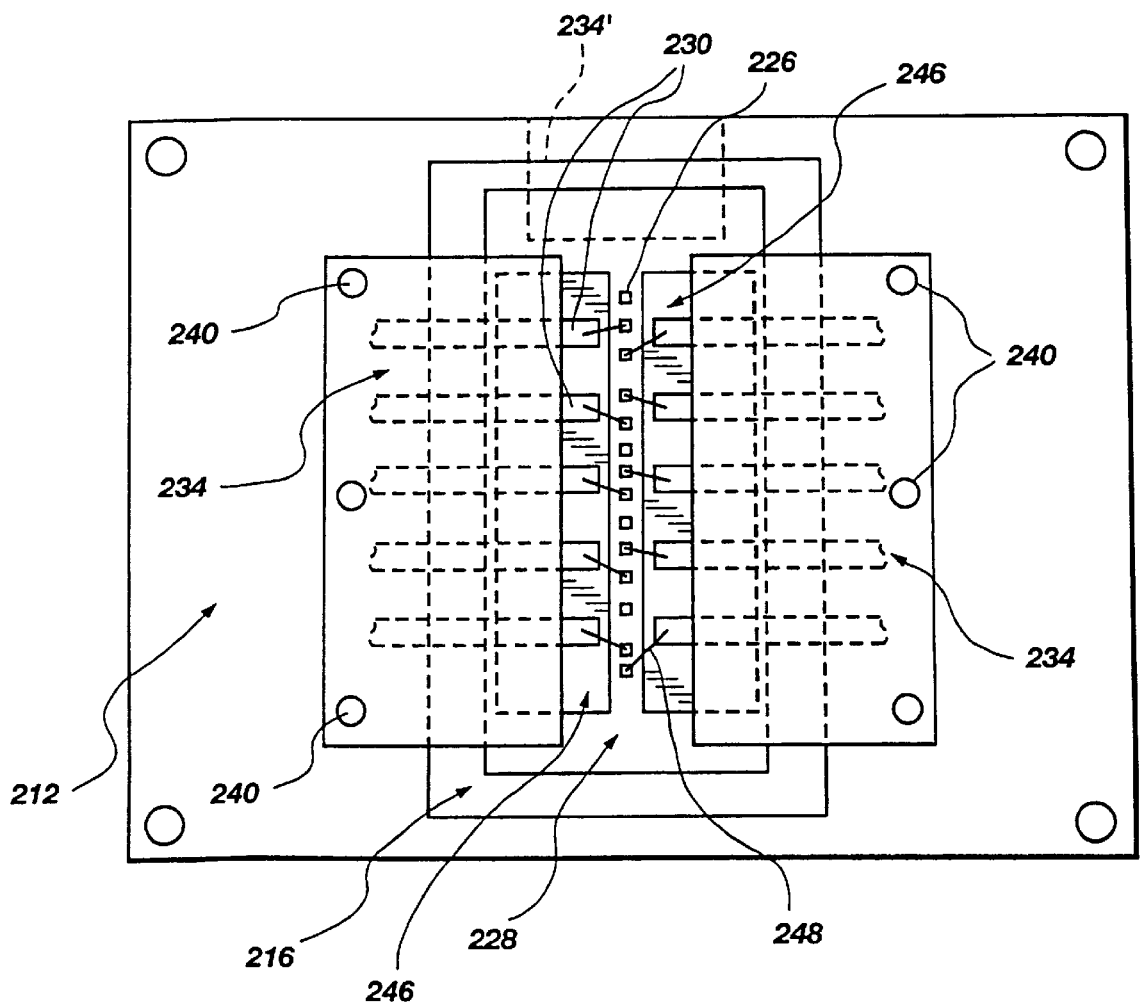
FIG. 7 is a top view of yet another preferred embodiment of the invention.

FIG. 7 depicts yet another preferred embodiment of the invention, wherein a semiconductor die 228 with a central row of bond pads 226 is maintained in position by a primary clamp 212 having leaf spring secondary clamps 234 extending over bond site window 216. As shown in FIG. 7, clamps 234 may be maintained in position by set screws or bolts 240, as desired. Lead fingers 230 of a lead frame to which die 228 is secured are resiliently clamped against the active surface of die 228 through dielectric tape 246. Wire bonds 248 extend between bond pads 226 and lead fingers 230, it is preferred, but not absolutely required, that clamp 212 include a lip on its underside to contact the lead fingers 230 outboard of the contact by secondary clamps 234. As with clamps 134, the presser foot portions of clamps 234 may be of any suitable configuration. It should be further understood that one or more additional clamps 234', as shown in broken lines, may be included at an end of bond site window 216 if additional lead fingers 230 or buses (not shown) extend over die 228 at one or both ends of die 228.

Figure 8:
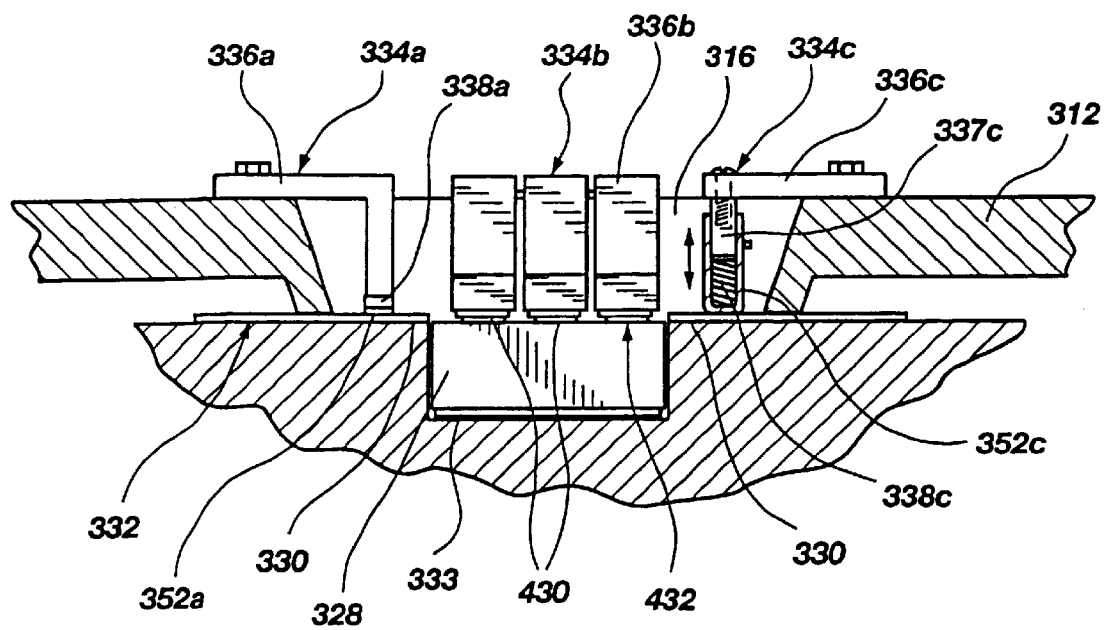
FIG. 8 is a side view of yet another preferred embodiment of the invention illustrating a secondary clamp configuration.

It should be further understood that the present invention is adapted to lead frame and die structures wherein both LOC and conventional lead fingers are employed together, as may be practiced with a dual lead frame construction wherein a first lead frame 332 with a die attach pad 333 and lead fingers 330 terminating at the die periphery is used with a second LOC lead frame 432 to provide additional lead fingers 430 and/or buses for additional electrical connections to die 328. In such a case, as illustrated in FIG. 8, a combination of secondary clamps 334a, 334b and 334c may be employed to secure the lead fingers in position for wire bonding. A dual lead frame structure is also disclosed in U.S. Pat. No. 4,984,059 to Kubota et al.

FIG. 8 also illustrates three additional variations of a secondary clamp which may be employed in the present invention. Clamps 334a, 334b and 334c are depicted secured to an exemplary primary clamp 312 and extending into bond site window 316. Clamp 334a includes a rigid body 336a having a compliant insert (as, for example, an elastomer disc) 338a bonded to the distal end thereof, a presser foot 352a of metal or some other non-compliant material being secured to insert 338a to contact lead fingers 330. Clamp 334b is a multi-fingered resilient structure formed of sheet material such as spring steel and comprising a plurality of biasing fingers 336b, similar in configuration to secondary clamps 134, emanating from a common base secured to primary clamp 312 and of a number, size and arrangement to contact individual leads such as lead finger 430, buses, or other lead frame elements to be stabilized. Clamp 334c includes a rigid body 336c with a downwardly-extending mandrel 337c having a vertically slidable tubular presser foot 352c biased downwardly thereon by a spring 338c, illustrated as a coil spring although a belleville spring or other spring configuration may be employed with equal effectiveness. It should be noted that rigid body 336c, as illustrated, may comprise a flat metal plate having apertures formed therein for a plurality of mandrels 337c to be secured thereto in a pattern selected for contact of specific lead frame elements to be stabilized.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. A method of clamping a lead frame and semiconductor die assembly for wire bonding, comprising:

providing a heater block;

disposing a lead frame with a semiconductor die secured thereto on said heater block;

substantially clamping said lead frame toward said heater block at a first location; and resiliently clamping said lead frame over an active surface of said semiconductor die at a second location.

2. The method of claim 1, wherein said substantially clamping is effected at said first location by clamping said lead frame against said heater block.

3. The method of claim 1, wherein said resilient clamping is effected at said second location by clamping said lead frame against said heater block.

4. The method of claim 1, wherein said resilient clamping is effected at said second location by clamping said lead frame outside of the periphery of said semiconductor die.

5. The method of claim 1, wherein said substantially rigid clamping is effected outside of the periphery of said semiconductor die.

6. The method of claim 1, further comprising resiliently clamping said lead frame toward said heater block at at least a second location.

7. The method of claim 6, further comprising resiliently individually clamping a plurality of individual lead frame elements toward said heater block.

8. A method of clamping a lead frame and semiconductor die assembly for wire bonding, comprising:

providing a heater block;

providing a primary clamp having at least one resilient secondary clamp disposed thereon;

disposing at least one lead frame with a semiconductor die secured thereto between said heater block and said primary clamp;

engaging said at least one lead frame with said primary clamp to clamp said at least one lead frame against said heater block; and engaging said at least one lead frame with said at least one resilient secondary clamp to resiliently clamp said at least one lead frame against said heater block.

9. The method of claim 8, wherein said engaging said at least one lead frame with said at least one resilient secondary clamp is effected inside of the periphery of said semiconductor die.

10. The method of claim 8, further including providing said primary clamp with at least one bond site window and locating at least one resilient secondary clamp disposed on said primary clamp over said at least one bond site window.

11. The method of claim 10, further comprising:

engaging a plurality of lead frames with said primary clamp to clamp said lead frames against said heater block; and engaging each of said plurality of lead frames with at least one resilient secondary clamp to resiliently clamp said plurality of lead frames against said heater block.

12. A method of clamping a lead frame and semiconductor die assembly for wire bonding, comprising:

providing a heater block;

disposing at least one lead frame with at least one semiconductor die secured thereto against said heater block;

providing a primary clamp having at least one resilient secondary clamp disposed thereon;

engaging said at least one lead frame with said primary clamp to clamp said at least one lead frame against said heater block; and engaging said at least one lead frame with said at least one resilient secondary clamp to resiliently clamp said at least one lead frame against said heater block.

13. The method of claim 12, wherein said engaging said at least one lead frame with said at least one resilient secondary clamp is effected inside of the periphery of said at least one semiconductor die.

14. The method of claim 12, further including providing said primary clamp with at least one bond site window and locating at least one resilient secondary clamp disposed on said primary clamp over said at least one bond site window.

15. The method of claim 12, further comprising:

engaging a plurality of lead frames with said primary clamp to clamp said lead frames against said heater block; and engaging each of said plurality of lead frames with at least one resilient secondary clamp to resiliently clamp said plurality of lead frames against said heater block.

16. A method of clamping a lead frame and semiconductor die assembly for wire bonding, comprising:

providing a heater block;

disposing a lead frame with a semiconductor die secured thereto on said heater block;

substantially clamping said lead frame toward said heater block at a first location; and resiliently clamping said lead frame toward said heater block at a second location, said second location inside the periphery of said semiconductor die.

17. A method of clamping a lead frame and semiconductor die assembly for wire bonding, comprising:

providing a heater block;

disposing a lead frame with a semiconductor die secured thereto on said heater block;

substantially clamping said lead frame toward said heater block at a first location; and resiliently clamping said lead frame toward said heater block at a plurality of locations, wherein at least one of said plurality of locations lies outside of the periphery of said semiconductor die, and at least another of said plurality of locations lies inside of the periphery of said semiconductor die.

* * * * *